United States Patent [19]

Yamazaki

[11] Patent Number: 5,197,652
[45] Date of Patent: Mar. 30, 1993

[54] WIRE BONDING METHOD AND APPARATUS WITH LEAD PRESSING MEANS

[75] Inventor: Nobuto Yamazaki, Tokyo, Japan

[73] Assignee: Kabushiki Kaisha Shinkawa, Tokyo, Japan

[21] Appl. No.: 601,518

[22] Filed: Oct. 23, 1990

[30] Foreign Application Priority Data

Oct. 23, 1989 [JP] Japan .................. 1-275157

[51] Int. Cl.⁵ .................................. H01L 21/60
[52] U.S. Cl. .................. 228/44.7; 228/212; 269/903
[58] Field of Search .......... 228/179, 212, 4.5, 44.7, 228/904, 47; 269/73, 113, 114, 109, 254 R, 254 CS, 903

[56] References Cited

U.S. PATENT DOCUMENTS

| | | | |
|---|---|---|---|
| 3,648,354 | 3/1972 | Mashino et al. | 228/4.5 |
| 3,995,845 | 1/1976 | Scheffer | 228/212 |
| 4,053,096 | 10/1977 | Heim | 228/4.5 |
| 4,434,347 | 2/1984 | Kurtz et al. | 228/179 |
| 4,600,138 | 7/1986 | Hill | 228/179 |
| 4,821,945 | 4/1989 | Chase et al. | 228/179 |

FOREIGN PATENT DOCUMENTS

| | | | |
|---|---|---|---|
| 2584325 | 1/1987 | France | 228/179 |
| 58-182843 | 10/1983 | Japan | 228/904 |
| 63-86538 | 4/1988 | Japan | 228/179 |
| 64-4095 | 1/1989 | Japan | 228/179 |
| 1-318238 | 12/1989 | Japan | 228/4.5 |
| 431981 | 11/1974 | U.S.S.R. | 228/44.1 |

Primary Examiner—Richard K. Seidel
Assistant Examiner—Jeanne M. Elpel
Attorney, Agent, or Firm—Koda and Androlia

[57] ABSTRACT

In a wire bonding method and apparatus to bond electrodes on pellets to leads on lead frames, substrates, when such a bonding is performed, a portion of the lead away from bonding point of the lead is pressed by a pressing section of pressing arm which is moved vertically and horizontally by lead pressing device.

2 Claims, 1 Drawing Sheet

WIRE BONDING METHOD AND APPARATUS WITH LEAD PRESSING MEANS

BACKGROUND OF THE INVENTION

1. Field of the Invention

The present invention relates to a wire bonding method and apparatus and more particularly to a lead-pressing method and apparatus for pressing leads which are installed on lead frames, substrates.

2. Prior Art

In cases where wires are bonded to electrodes on pellets and leads which are provided on lead frames, substrates, etc. (hereafter, both lead frames and substrates will be referred to in general as "lead frames"), the leads are pressed against a heating block by a lead-pressing plate.

In conventional lead-pressing devices, a lead pressing plate has a square window formed in it (so that the tips of the respective leads are exposed) and is installed above the lead frame. All of the leads are pressed against the heating block by this lead-pressing plate.

One example of lead-pressing devices of this type is disclosed in Japanese Patent Publication No. 59-5976.

In this and other prior art, if the lead pressing positions change due to differences in the type of articles being processed, the pressing plate must be replaced with a new pressing plate which has a square window of an appropriate size for the lead frames. As a result, the wire bonder must be stopped during the operation, thus dropping working efficiency of the wire bonder. Since a multiple number of pressing plates must be prepared in order to handle various types of articles, storage and control become complicated.

SUMMARY OF THE INVENTION

Accordingly, a primary object of the present invention is to improve the working efficiency of a wire bonding method and apparatus wherein electrodes on pellets and leads on lead frames are bonded to each other by means of wire bonder.

The object of the present invention is accomplished by a wire bonding method which is characterized by the fact that when bonding to the leads (that are to be wire-bonded) is performed, portions of the leads that are away from the bonding points of the leads are pressed down by pressing sections of pressing arms which are movable in X and Y directions and in a vertical direction.

The object of the present invention is also achieved by a wire bonding apparatus that includes a lead-pressing device which has (i) a pressing arm with a pressing section that presses against a portion of the leads that is away from the bonding points of the leads and (ii) a pressing head which drives the pressing arm so that the arm moves in the X and Y directions and in the vertical direction. Thus, bonding is performed while the portions of the leads that are away from the bonding points are being pressed down by the pressing sections.

The leads that are to be bonded are pressed down by the pressing sections of the pressing arms which are driven in the X and Y directions and in the vertical direction. The positions to which these pressing sections are moved are programmed in advance in a computer which controls the lead-pressing device. Accordingly, changes in the type of article to be processed do not affect working efficiency of the bonding.

DETAILED DESCRIPTION OF THE INVENTION

Figure 1:
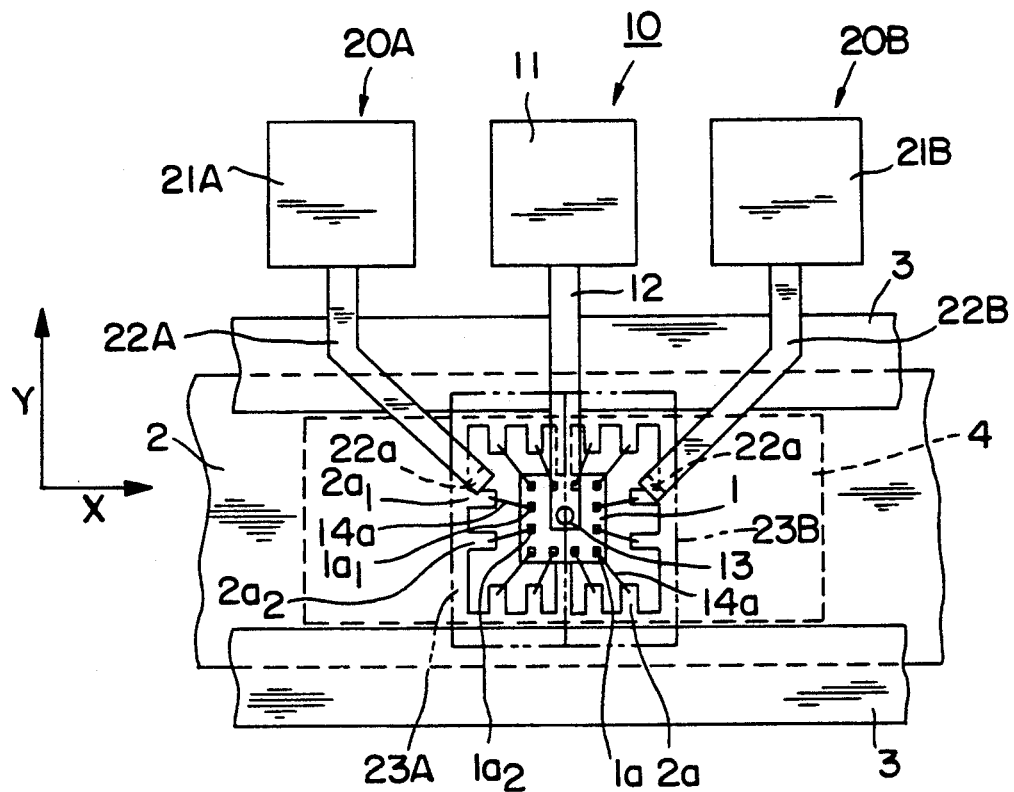
FIG. 1 is a schematic plan view illustrating one embodiment of the present invention.
Figure 2:
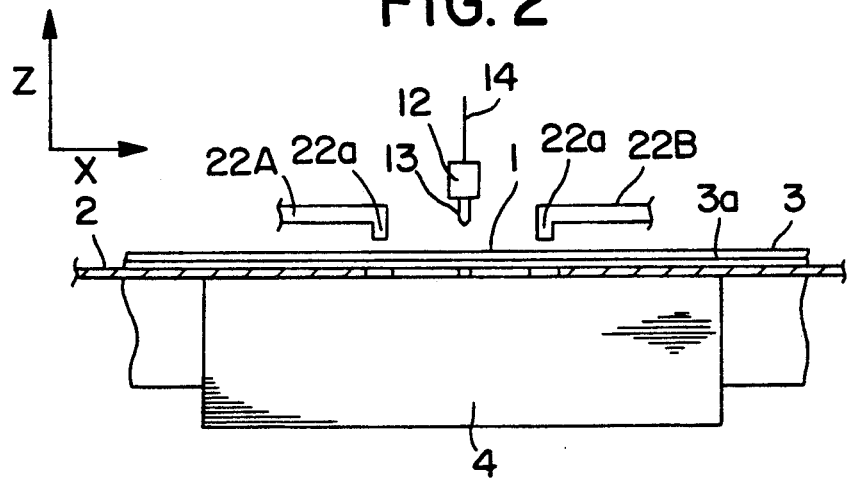
FIG. 2 is a schematic cross-section thereof.

One embodiment of the present invention will be described with reference to FIGS. 1 and 2.

A lead frame 2 to which a pellet 1 is attached is guided by guide grooves 3a formed in a pair of parguide rails 3. The guide rails are installed to face each other. The lead frame 2 is intermittently fed and positioned by a feeding device (not shown).

A heating block 4 is provided between the guide rails 3. The heating block 4 is driven up and down by a vertical driving means (not shown).

A bonding arm 12 which is raised and lowered by a vertical driving means (not shown) is attached to a bonding head 11, and a bonding tool 13 which performs wire bonding is fastened to the tip of the bonding arm 12.

The movement of the bonding head 11 in the X and Y directions and the movement of the bonding arm 12 in the vertical direction are controlled by a computer (not shown).

The bonding tool 13 is driven in the X and Y directions and in the vertical direction so that a wire 14 which passes through the bonding tool 13 is bonded to respective pairs of electrodes 1a on the pellet 1 and leads 2a on the lead frame 2. Thus, wire segments 14a are connected between the electrodes 1a and leads 2a.

Since the structure and operation described above are generally known, further description is omitted here.

In the present invention, two lead-pressing devices 20A and 20B are provided on either side of the bonding head 11. The driving systems of the lead-pressing devices 20A and 20B have more or less the same construction as the driving system of the wire bonder 10. Specifically, pressing arms 22A and 22B which are moved up and down by vertical driving means (not shown) are fastened to pressing heads 21A and 21B which are movable in the X and Y directions. Pressing sections 22a which press against the leads 2a are formed at the tips of the pressing arms 22A and 22B.

The lead-pressing devices 20A and 20B thus constructed are controlled by a computer (not shown) in the same manner as the wire bonder 10 is controlled.

Specifically, the lead-pressing devices 20A and 20B are controlled in accordance with data which is programmed beforehand in the computer so that the pressing sections 22a press against portions of the leads 2a that are away from the bonding points of the leads 2a. Two lead-pressing devices 20A and 20B are used in this embodiment, and the devices 20A and 20B are controlled as follows: the leads 2a in the left-hand half region 23A (surrounded by a two-dot chain line) are pressed by the left-side lead pressing device 20A, and the leads 2a in the right-hand half region 23B are pressed by the right-side lead-pressing device 20B.

More specifically, when a wire segment 14a is to be connected to the electrode $1a_1$ and lead $2a_1$ in the region 23A, the lead-pressing device 20A is moved in the X and Y direction and the pressing arm 22A is moved in the vertical direction. Thus, a portion of the lead $2a_1$ which is away from the bonding point of the lead $2a_1$ is pressed down by the pressing section 22a of the pressing arm 22A. Then, the bonding tool 13 is driven in the X and Y directions and in the vertical direction, so that with the wire 14 passing through the bonding tool 13, bonding is performed.

Similarly, when bonding is performed between the electrode $1a_1$ and lead $2a_2$ in the region 23B, the lead-pressing device 20B is moved in the X and Y directions and the pressing arm 22B is moved in the vertical direction so that the pressing section 22a of the pressing arm 22B presses against a portion of the lead $2a_2$ which is away from the bonding point of the lead $2a_2$.

Thus, the leads 2a (i.e., $2a_1$, $2a_2$) that are to be bonded are pressed down by the pressing sections 22a of the pressing arms 22A and 22B which are driven in the X and Y directions and in the vertical direction. Accordingly, the time required for change-over of the type of article being processed can be greatly reduced by pre-programming the movements of the pressing sections 22a in the computer in accordance with the type of article to be processed.

Furthermore, in the above embodiment, two lead-pressing devices 20A and 20B are used. However, it goes without saying that only one lead-pressing device, or three or more lead pressing devices can also be used.

In the present invention, as is clear from the above description, leads that are to be bonded are pressed down by pressing sections of pressing arms which are driven in the X and Y directions and in the vertical direction. Accordingly, the time required for change-over of the type of article being processed is greatly reduced. As a result, the working efficiency of the wire bonder is improved.

I claim:

1. A bonding apparatus, in which electrodes on pellets and leads on lead frames are individually bonded to each other by means of a wire bonder, characterized in that said apparatus comprises a lead-pressing means which has at least two pressing arms with a corresponding pressing section at the end wherein one of said at least two pressing sections presses against a portion of said lead that is away from a bonding point thereof, a lead-pressing head for each of said at least two pressing arms which drives said at least two pressing arms in X and Y directions and in a vertical direction, so that bonding is performed while said portion of said lead that is away from said bonding point thereof is pressed down by said pressing section.

2. A wire bonding method in which electrodes on pellets and leads on lead frames are individually bonded to each other during a bonding step using a wire bonder, said method comprising pressing down during said bonding step a portion of said lead that is away from a bonding point of said lead by one of at least two pressing arms with each having a corresponding pressing section, and driving said at least two pressing arms and corresponding pressing section individually in X and Y directions and in a vertical direction.

* * * * *